025B1

(12) United States Patent
Danovitch et al.

(10) Patent No.: US 7,348,270 B1
(45) Date of Patent: Mar. 25, 2008

(54) TECHNIQUES FOR FORMING INTERCONNECTS

(75) Inventors: David H. Danovitch, Granby (CA);
Mukta G. Farooq, Hopewell Junction, NY (US); Peter A. Gruber, Mohegan Lake, NY (US); John U. Knickerbocker, Wappingers Falls, NY (US); George R. Proto, Poughkeepsie, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/625,449

(22) Filed: Jan. 22, 2007

(51) Int. Cl.
*H01L 21/44* (2006.01)
(52) U.S. Cl. .................. 438/613; 438/614; 438/618; 438/598; 257/E21.59
(58) Field of Classification Search ............... 438/613, 438/614, 618, 598
See application file for complete search history.

(56) References Cited

U.S. PATENT DOCUMENTS

| 5,244,143 | A |  | 9/1993 | Ference |  |
|---|---|---|---|---|---|
| 5,775,569 | A | * | 7/1998 | Berger et al. | 228/254 |
| 6,105,852 | A |  | 8/2000 | Cordes |  |
| 6,149,122 | A | * | 11/2000 | Berger et al. | 249/119 |
| 2007/0045515 | A1 | * | 3/2007 | Farnworth et al. | 250/208.1 |

* cited by examiner

*Primary Examiner*—Asok K. Sarkar
*Assistant Examiner*—Victor V. Yevsikov
(74) *Attorney, Agent, or Firm*—Ryan, Mason & Lewis, LLP; Daniel P. Morris, Esq.

(57) ABSTRACT

A method for forming interconnects onto attachment points of a wafer includes the steps of providing a mold with a plurality of cavities having a predetermined shape, depositing a release agent on surfaces of the cavities, filling the cavities with an interconnect material to form the interconnects, removing the release agent from the mold, and attaching the interconnects to the attachment points of the wafer. An adhesive layer can optionally be deposited in addition to the release layer. The adhesive layer can be used, for example, to bond the chip to a package.

22 Claims, 6 Drawing Sheets

TECHNIQUES FOR FORMING INTERCONNECTS

FIELD OF THE INVENTION

The present invention generally relates to the electrical and electronic arts and, more particularly, to formation of interconnects for circuits and the like.

BACKGROUND OF THE INVENTION

Silicon chips are built on silicon wafers and diced into chips. Known interconnection techniques include wire bonding and so-called flip chip or area array techniques, also known as C4 (controlled collapse chip connection). An array of solder bumps is formed on a chip before the dicing process. The solder bumps may be formed by plating the back side of the wafer through a resist layer. Plating is chemically dependent and can be difficult to control for complex solders. Plating has been used for high melting point solder (e.g., 97% Pb, 3% Sn) and can be used for some lead-free solders desirable for environmental reasons (e.g., SnCu or SnCuAg). However control of exact solder composition for some lead free solders can be difficult or impossible to achieve with good solder composition uniformity and repeatability. Injection molded solder (IMS) is preferred for such materials. A pressure nozzle is employed over the top of a glass plate with holes, which functions as a mold. Solder flows into the cavities and a small amount of solder is left behind, which can be transferred to the wafer. Control of solder composition can be easily controlled using the IMS process.

In current IMS techniques, an etched glass mold is used to form solder small solder regions, typically bowl-shaped, approximately twice as wide as they are deep. When reflow is initiated, the regions tend to "ball up" (assume a substantially spherical shape) due to surface tension. When transferring material to a workpiece from an IMS mold, wettability, transfer and mold adhesion issues can upset the effective transfer. In addition, if a solder column was desired, the removal of a solder column from the mold would be difficult or impossible depending on aspect ratio of the solder column. To improve the quality of solder transfer and to support novel shape transfer, a mechanism other than good wetting, chemical affinity and capillary action is desired for complete transfer and release from the mold.

Accordingly, it would be desirable to overcome the limitations of prior art approaches.

SUMMARY OF THE INVENTION

Principles of the present invention provide techniques for forming interconnects. An exemplary embodiment of a method for forming interconnects onto attachment points of a wafer, according to one aspect of the present invention, includes the steps of providing a mold with a plurality of cavities having a predetermined shape, depositing a release agent on surfaces of the cavities, filling the cavities with an interconnect material to form the interconnects, removing the release agent from the mold, and attaching the interconnects to the attachment points of the wafer.

In one or more embodiments, inventive techniques can form generally column-shaped interconnects, unlike prior art techniques, which ale generally limited to spherical "bumps" (although the invention is not limited to column-shaped interconnects). In another aspect, an adhesive layer can be deposited in addition to the release layer. The adhesive layer can be used, for example, to bond the chip to a package.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
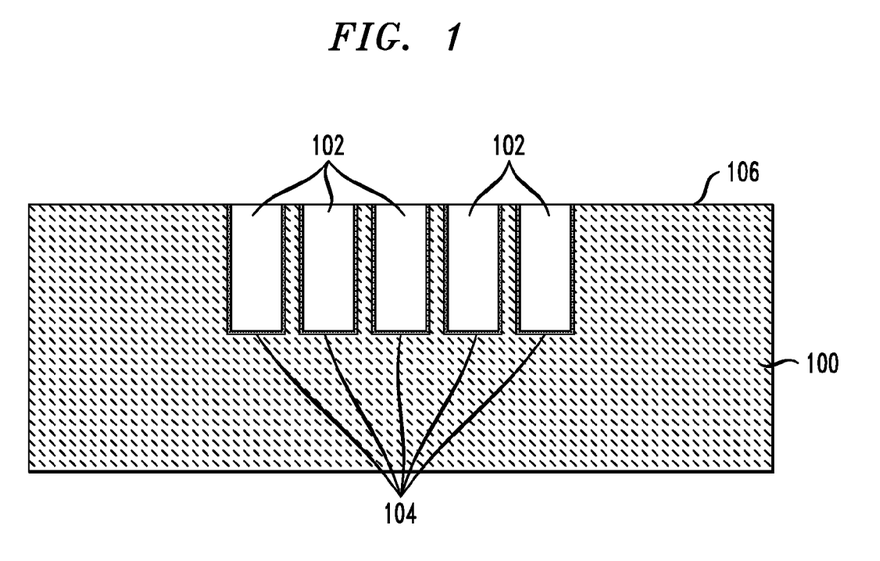
FIGS. 1-3 show steps in an exemplary method according to one aspect of the invention.

An exemplary method for forming interconnects onto attachment points of a wafer will now be described with respect to the figures, in which like reference characters are used throughout to refer to like elements, unless otherwise noted. With reference to FIG. 1, which is a cross-sectional view (as are the other figures), one step of the method includes providing a mold 100 with a plurality of cavities 102 having a predetermined shape. The mold 100 may optionally be formed with a coating 104 in the cavities (and/or elsewhere, such as on upper surface 106). The coating could be, for example, an oxide, nitride or oxide-nitride layer if the mold is silicon, to form $SiO_x$, $SiN_x$ or $SiO_xN_y$ using deposition processes such as plasma enhanced chemical vapor deposition (PECVD) or thermally grown coatings. Other surface treatments such as, but not limited to, TiN or TaN depositions or polymer depositions may also be used to alter surface and/or cavity properties depending on desired material fill and release characteristics. In another exemplary approach, the mold 100 can be formed from glass having a coefficient of thermal expansion (CTE) substantially matched to that of silicon, preferably also substantially transparent to laser radiation or light (such as ultraviolet), or a good conductor of heat, for reasons to be more fully explained below. When borosilicate glass was used as the mold material, some solder compositions such as high lead solder (97% Pb, 3% Sn) have been shown to have difficulty in being transferred to the Ball Limiting Metallurgy (BLM) pads on the wafer due to control between BLM pad wettability, surface properties of the solder, any in situ fluxes and surface properties of the glass. In such applications, defect density of transfer can be encountered which leaves many solder bumps on the mold after transfer rather than transfer to the wafers BLM pads. A thin dielectric layer which has good adhesion to glass, is non-wettable to solder, and can be conformally deposited over the surface of the cavities 102 will be desired for coating 104. Where employed, the coated layer is preferred to be robust and reusable.

Figure 2:
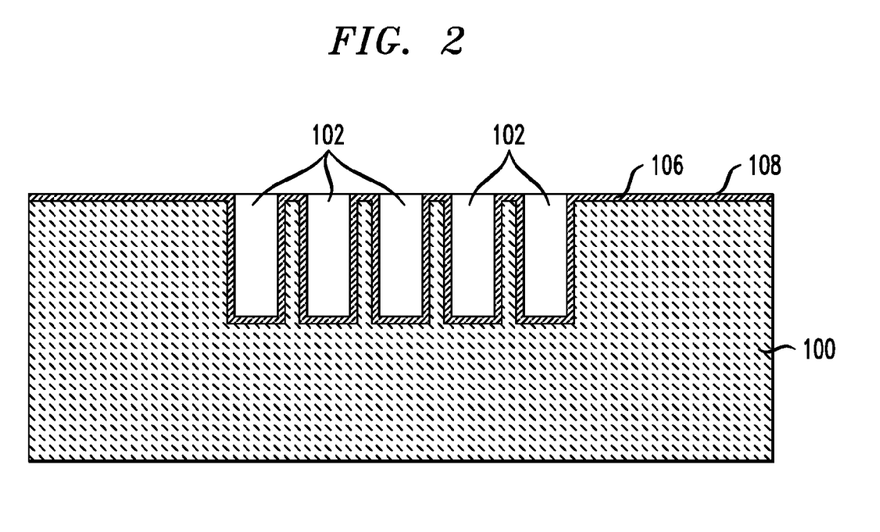

Turning now to FIG. 2, another method step can include depositing a release agent 108 on surfaces of the cavities 102 (and optionally on surface 106). Note that for purposes of illustrative convenience, coating 104 is depicted only in FIG. 1; it should be understood that the exemplary steps depicted are applicable to molds with or without coatings. The release agent can be, for example, a polymer deposited via spinning, spraying, vapor deposition, and/or dipping. Where mold 100 has a coating 104, the release agent would be deposited over coating 104; where no coating 104 is present, the release agent would be deposited directly over the surfaces of cavities 102. One suitable polymer for agent 108 is polyimide but other polymers, resists or treatments can be employed as desired.

As will be discussed more fully below, release of interconnects from mold 100 can, in one or more embodiments, be effectuated via laser irradiation, light or heat. Release of a material to be transferred from the mold 100 is carried out by impinging a specific wavelength through the mold 100 to induce a chemical or physical change in a release material layer 108 such that the material to be transferred is more readily separated from the release material layer 108 than it would otherwise be from the mold 100 alone. Such considerations can be taken into account when selecting release agent 108.

Figure 3:
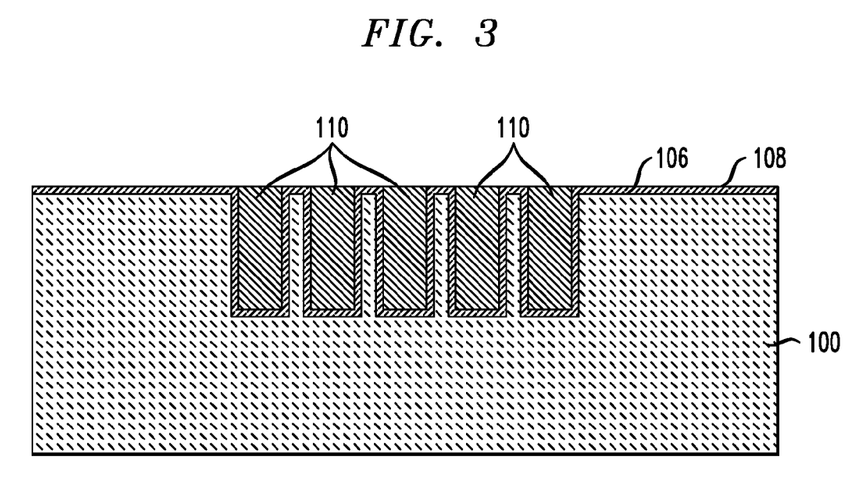

As shown in FIG. 3, another method step can include filling the cavities with an interconnect material to form the interconnects 110. The material can include, for example, solder, copper, nickel, a composite interconnect material, and/or other suitable alternatives. As will be discussed more fully below, the release agent 108 can be removed from the mold 100, and the interconnects 110 can be attached to appropriate attachment points of the wafer.

Figure 4:
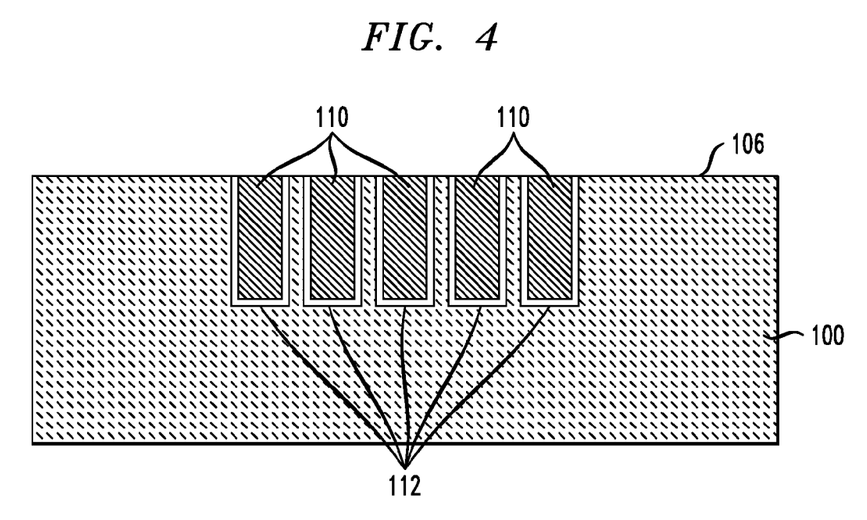
FIG. 4 shows a first exemplary release technique for the method of FIGS. 1-3.

In a first approach, shown in FIG. 4, the release agent 108 is removed with the interconnects 110 still in the mold 100, prior to the attaching step. The removing step can be carried out via application of thermal energy to cause the release agent to transition to a gaseous state (preferably without affecting the mold or the interconnects). In another approach, alluded to above, the mold 100 is formed from a material substantially transparent to laser light, and the removing step is carried out by causing the laser light to impinge on the release agent through the mold so as to cause the release agent to transition to vapor or a gaseous state (in other approaches the release material might be vaporized, depolymerized or altered with laser or ultraviolet light or "softened" by going above the material's glass transition region or otherwise modified so as to enhance release of the molded material(s). The removal of release agent 108 can results in voids 112. Note that in typical applications, the width of the interconnects 110 is from about 2 microns to about 100 microns, while the thickness of the release agent may typically be less than 0.1 to 1 micron. Thus, some misalignment caused by "tolerances" between the interconnects 10 and the cavities 102 is tolerable. The foregoing dimensions are purely by way of example and are not intended to be limiting.

Figure 5:
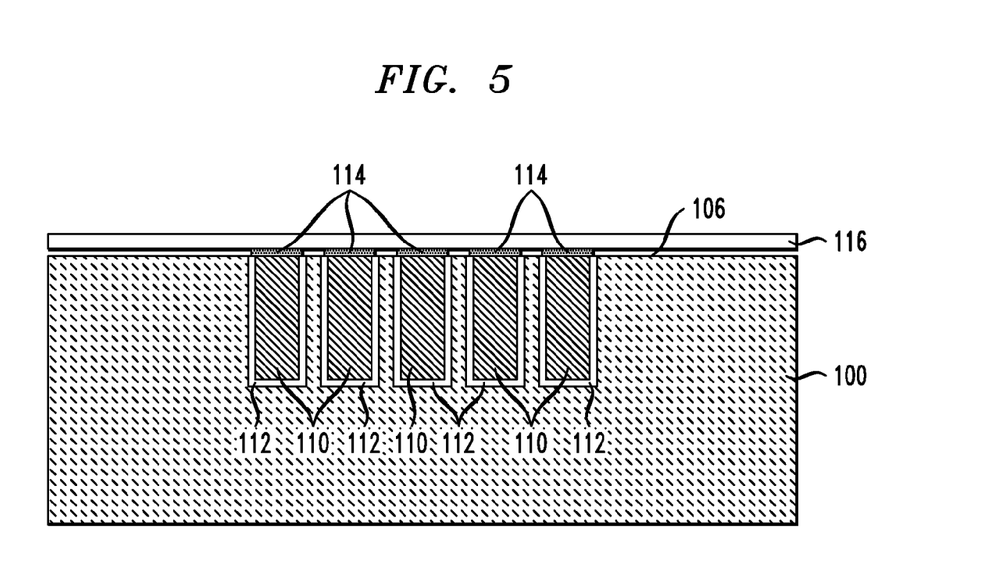
FIGS. 5 and 6 show a second exemplary release technique for the method of FIGS. 1-3.

Turning now to FIG. 5, it will be seen that other approaches are possible. For example, the interconnects 110 can be attached to pads 114 on wafer 116 substantially contemporaneously with the removal of the release agent, for example by substantially simultaneous release agent vaporization and attachment and/or curing of the interconnects 110 to wafer pads 114. Alternatively, the release agent could be removed subsequent to the attaching step, for example by release agent vaporization after attachment of the interconnects 110 to wafer pads 114, such as with use of polymer which is partially polymerized and latex fully cured to complete a polymer cross linking reaction.

As noted, release may be effectuated by application of thermal energy by other than laser radiation. Of course, in such case, mold 100 need not be transparent to laser radiation. In one possible approach, the interconnects 110 are formed from high melting point solder, with a "bump" of low melting point solder on the top to aid in joining to the pads of the wafer. For example, the low melt could have a first temperature point where it melts, the release agent could have a second temperature point where it releases, which could be higher than the first temperature point, and the high melting point solder could have a melting point above both such temperature points. Purely by way of example and not limitation, the low melt solder could be 37% Pb 63% Sn with a melting point of about 183 C, and the high melting point solder could be 97% Pb 3% Sn with a melting point of about 325 C. The interconnects 110 could be aligned with the pads 114 and the assembly heated to 215 C so the low melt solder would reflow; the assembly could then be "flipped" and heat or laser action used to release the release agent.

Figure 6:
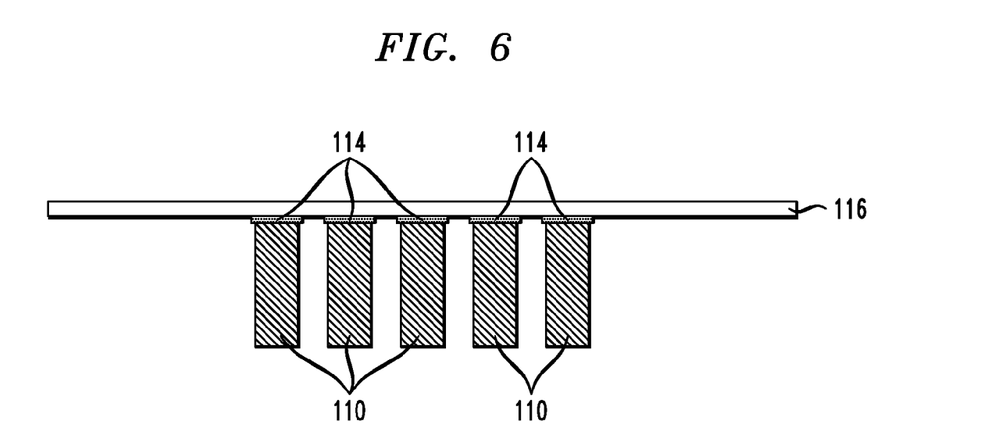

The finished assembly with inter connects 110 attached to pads 114 on wafer 116 is shown in FIG. 6. The techniques set forth herein can used to produce interconnects of a desired shape. In the example shown in FIGS. 1-6, the interconnects are generally column-shaped (substantially taller than their width). The ability to produce column-shaped interconnects is one potential advantage of one or more embodiments of the invention. Prior art techniques are generally limited to spherical-shaped "bumps" of solder. For example, a prior art solder ball might be generally spherical, about 100 microns in diameter, while a typical column interconnect produced using one or more inventive embodiments might be about 50 microns in diameter but might be 200 microns high. Higher interconnects are better able to accommodate mismatches in coefficient of thermal expansion (for example, between silicon with a coefficient of about 3 parts per million and organic materials with a coefficient of about 18 parts per million) than are substantially spherical prior-art solder balls, conductive polymer or metal interconnections, and thus less likely to suffer fatigue failure. Note that the dimensions set forth herein are exemplary and not to be taken as limiting. Interposing an epoxy or other material between chip and package can also be used to deal with coefficient of thermal expansion mismatch.

In one or more embodiments, it may be desirable for the release agent 108 to cling to the interconnects 110 upon removal from the mold 100. In another aspect, it may be desirable for the release agent 108 to be readily removable from the interconnects 110. The release agent 108 could be temporarily adherent to the interconnects 110 for protection. Further, the release agent could be made permanently adherent to the interconnects and/or a component dielectric for mechanical, thermal and/or reliability enhancement of an interconnection to a corresponding substrate, a corresponding chip, a corresponding board, and/or a corresponding component. In this last approach, an adhesive layer or a polymer could also be made adherent to the indicated items for the indicated purposes, along with the release agent. Further details regarding other possible approaches with adhesive are set forth below.

It may also be desired to coat a first material to be transferred with a second material that protects or otherwise enhances subsequent utilization of the first material. In this case, laser release works by impinging a specific wavelength through the mold to induce a chemical or physical change in a release material layer such that the release material is readily separated from the mold and becomes a second material that is adequately and appropriately adhered to the first material to be transferred.

Figure 7:
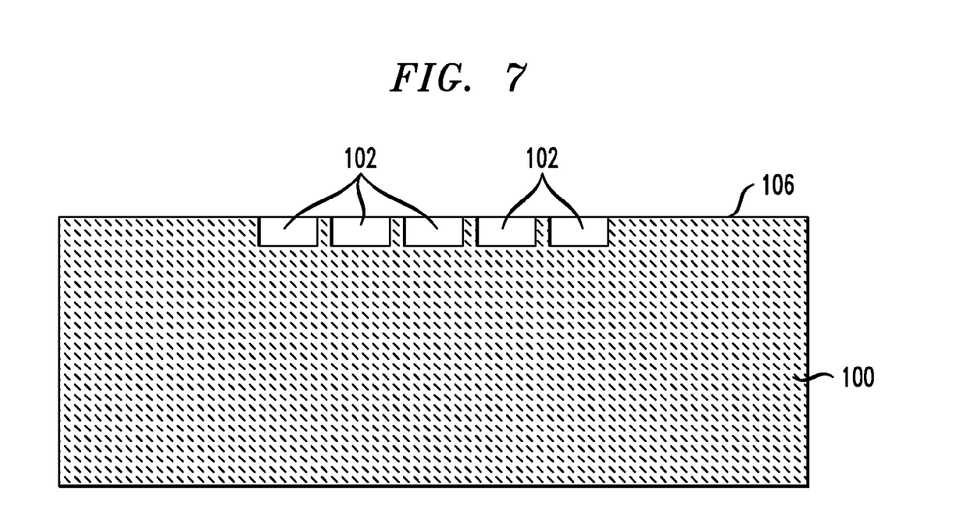
FIGS. 7-9 show steps in an exemplary method according to another aspect of the invention, wherein an adhesive layer is deposited.
Figure 8:
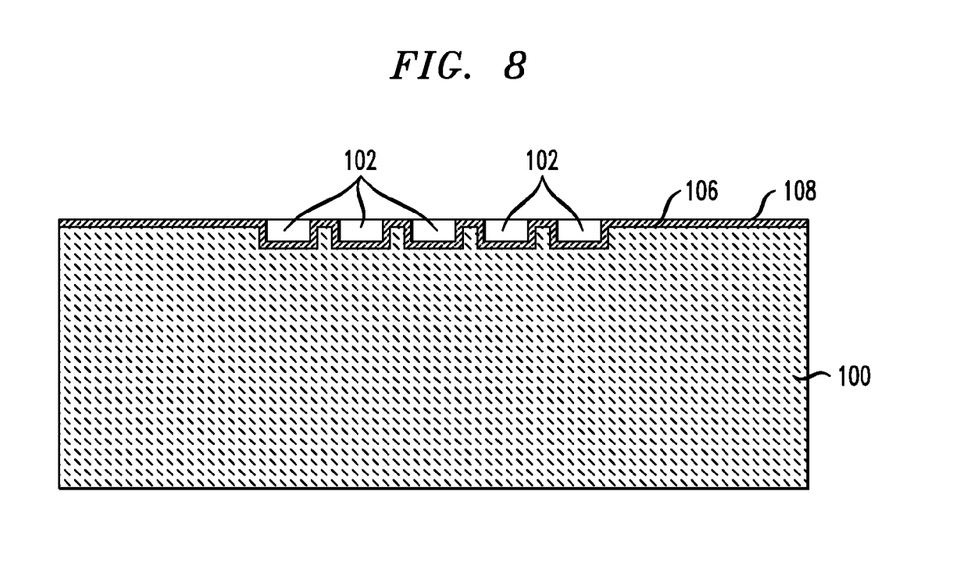
Figure 9:
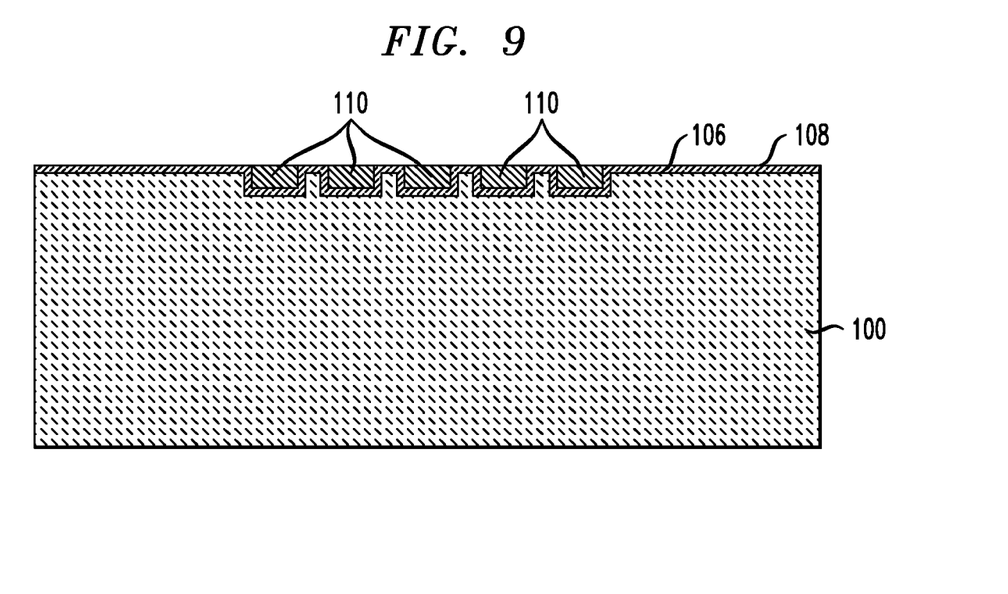

In another aspect, to be discussed with regard to FIGS. 7-13, an adhesive layer is deposited on the mold FIG. 7 is similar to FIG. 1, except that no coating 104 is shown and the cavities 102 are of a shallower configuration than in FIG. 1. These are purely for illustrative purposes, it being understood that techniques described herein can be used with molds with or without coatings, and for interconnects of any desired shape. In FIG. 8, similar to FIG. 2, the release agent and the adhesive layer are deposited substantially simultaneously, with the release agent and the adhesive realized in a multilayer polymer system (shown for illustrative convenience as material 108). Turning now to FIG. 9, the cavities 102 can be filled with the interconnect material through the adhesive layer 108, to form the interconnects 110. Alternatively, the adhesive layer 108 could be deposited (in a patterned fashion) subsequent to the step of filling the cavities 102 with the interconnect material (this would be applicable, for example, where the release agent was applied first and the adhesive was a separate layer).

Figure 10:
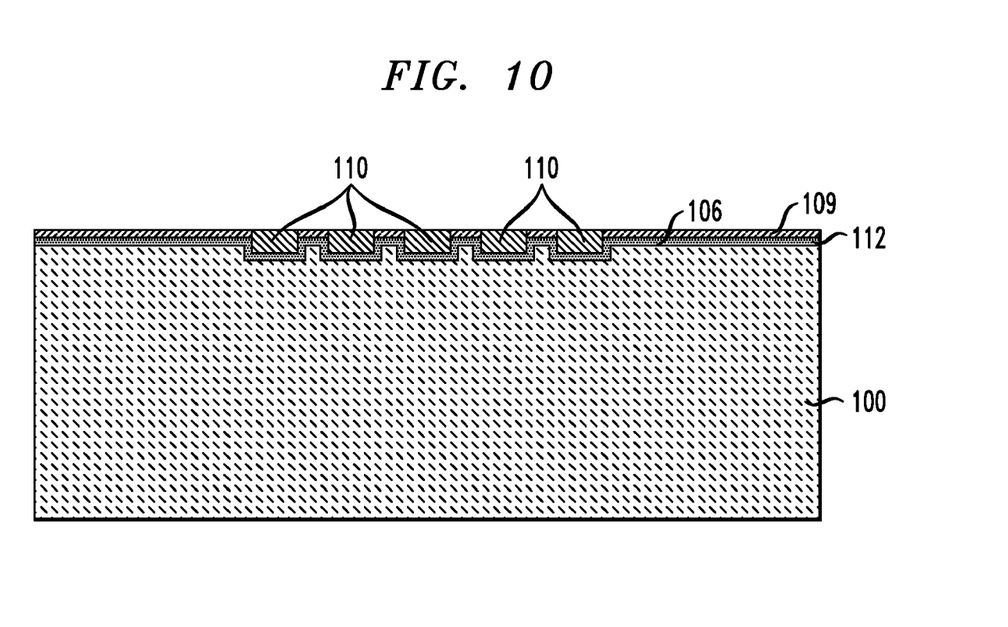
FIG. 10 shows a first exemplary release technique for the method of FIGS. 7-9.

In FIG. 10, similar to FIG. 4, the interconnects 110 (together with adhesive 108) can be released from mold 100 via laser or thermal techniques prior to interconnection with pads on a wafer; the adhesive is designed for transfer to the top of a wafer (an adhesive layer 109 ready for transfer is shown in FIG. 10; a wafer is shown in subsequent figures). The adhesive is released from the mold 100 and transfers to the top of the wafer; thus, both the interconnects and the adhesive layer ale transferred.

Figure 11:
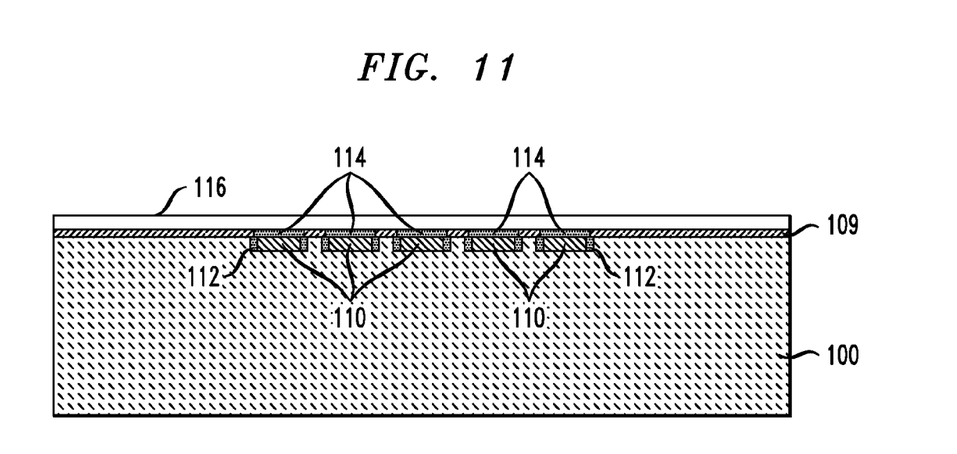
FIGS. 11-13 show a second exemplary release technique for the method of FIGS. 7-9.
Figure 12:
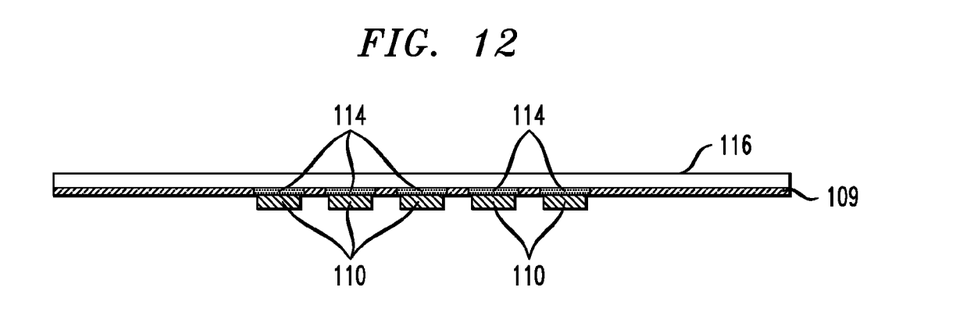

Alternatively, as shown in FIG. 11, the interconnects 110 can be joined to pads 114 or other contacts of wafer 116, for example, by soldering. The release agent is activated by laser radiation or thermal energy, and the mold 100 is removed, as shown in FIG. 12. The release can be done before or after securing to pads 114 of wafer 116; note voids 112 in FIG. 11 suggesting release via activation. Note also that although shown, for illustrative convenience, as approximately the same height as pads 114, adhesive layer 109, in one or more embodiments, is preferably substantially the same height as pads 114 plus interconnects 110. By way of example and not limitation, for release layers to be removed, thickness could range up to about 50 microns, while for layers to be retained for adhesive or other purposes, thicknesses could range from about 10 microns to about 100 microns (but again, any functional thickness can be employed).

Figure 13:
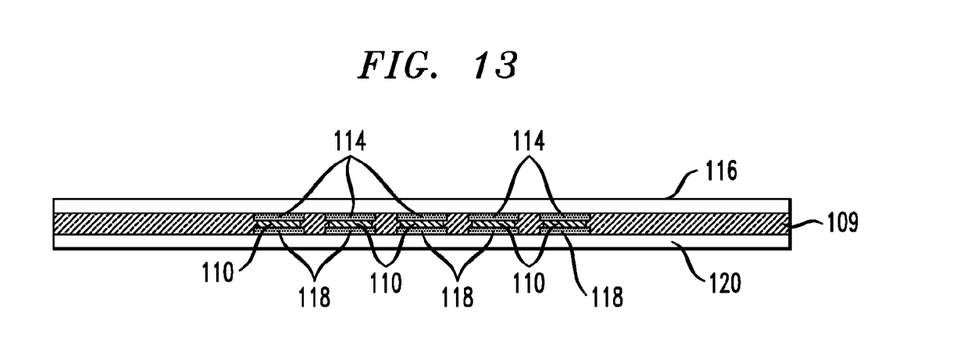

In FIG. 13, appropriate surface cleaning can be performed such as chemical cleaning and/or plasma ashing, the adhesive layer 109 can be activated, the interconnects 110 can be joined to the pads 118 of package 120, and the adhesive will join wafer 116 to package 120, aiding in mechanical integrity of the two joining components. Pads 110 can be single or multiple composition interconnections, transient liquid metal to intermetallic compound depending on desired proper joining temperature, any subsequent component joining temperature hierarchies and the desired contact joining surface such as a wafer with BLM pads with added activated adhesive layer between BLM pads. Joining could be to pads 110 after mold release. Thus, interconnects 110 are secured to a package 120 for wafer 116, and the adhesive layer is activated to bond the wafer 116 (or a portion thereof) to the package 120. The possibility of bonding a portion of wafer 116 is mentioned to cover the case where the wafer is divided into chips, packages, or the like. It should be noted that package 120 is exemplary of many items to which wafer 116 or a portion thereof can be attached; for example, attachment could also be to another substrate, chip, chip stack, board, wafer, or other component. Additionally, interconnection could also be to another structure with its own adhesive layer. It will be appreciated that layer 109 can provide mechanical and/or thermal interconnection, while interconnects 110 can provide electrical and/or thermal interconnection.

The embodiment of FIGS. 7-13 is advantageous in that it may allow precise control of adhesives such as epoxy and the like, which may be hard to flow for small feature sizes.

Further details and comments will now be provided. In one or more embodiments, mold 100 can be made, for example, from amorphous or crystalline Si or other material that does not absorb ultraviolet or visible light. Release layer 108 can be deposited via an IMS process or alternatively by some coating process, preferably conformal or partially conformal. The material should be a polymer that is capable of forming a continuous film, having a chromaphore in its backbone that undergoes chain scission or controlled degradation, and being compatible with other materials filling the mold 100.

Any material that generates a weak boundary layer between the IMS mold 100 and the other materials filling the IMS mold cavities 102 may be adequate. The material 108 should be capable of being deposited in a conformal or partially conformal manner such that the desired mold cavity shapes (wherein material filling by IMS occurs) can be maintained and/or controlled. The boundary layer should form when the laser is directed toward the back (surface opposite top 106) of the mold. In one or more embodiments, the entire release layer is converted to a boundary layer which causes separation between the material to be transferred and the release layer; and the release layer, in its boundary layer state is subsequently readily removable from the mold, hence allowing the mold to be reused. In another possible approach, the entire release layer is converted to a boundary layer which causes separation between the mold and the release layer; and the release layer, in its boundary layer state, is subsequently either readily removable from the transferred material or appropriately adherent to the transferred material either temporarily, for protection, or permanently, for enhancement.

Heat induced depolymerization, radical chain scission, structural rearrangement, melting or a phase change are all exemplary mechanisms for release.

In the case of mold 100 being made of glass material, to facilitate transfer of high lead solder, a thin layer 104 of metal which bonds well to glass and is readily oxidizable and thus not wettable to solder; or a dielectric layer, such as an oxide or nitride layer, can be conformally coated over the mold and cavity surface by chemical vapor deposition (CVD), physical vapor deposition (PVD) or PECVD processes. The coated layer can provide a robust surface which supports many reuses for the solder transfer mold.

The techniques set forth herein can be used to make circuits realized on an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., though the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products. The techniques set for the herein can be used for interconnecting the chip on chips or chip stacks for 3D applications, chips on wafers, chips on package or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for forming interconnects onto attachment points of a wafer, comprising the steps of:
   providing a mold with a plurality of cavities having a predetermined shape;
   depositing a release agent on surfaces of said cavities;
   filling said cavities with an interconnect material to form said interconnects;
   removing said release agent from said mold; and
   attaching said interconnects to said attachment points of said wafer.

2. The method of claim 1, wherein said release agent is removed with said interconnects in said mold, prior to said attaching step.

3. The method of claim 1, wherein said release agent is removed substantially contemporaneously with said attaching step.

4. The method of claim 1, wherein said release agent is removed subsequent to said attaching step.

5. The method of claim 1, wherein said mold is formed with a coating in at least said cavities.

6. The method of claim 1, wherein said release agent comprises a polymer.

7. The method of claim 6, wherein said polymer is deposited via one of spinning, spraying, vapor deposition and dipping.

8. The method of claim 1, wherein said removing step comprises applying thermal energy to cause said release agent to transition to a gaseous state.

9. The method of claim 1, wherein said mold is formed from a material substantially transparent to laser light, and wherein said removing step comprises causing said laser light to impinge on said release agent through said mold so as to cause said release agent to release from said surfaces.

10. The method of claim 1, wherein said mold is formed from a material substantially transparent to ultraviolet light, and wherein said removing step comprises causing said ultraviolet light to impinge on said release agent through said mold so as to cause said release agent to release from said surfaces.

11. The method of claim 1, wherein said release agent remains bonded to said interconnects when removed from said mold.

12. The method of claim 1, wherein said release agent is readily removable from said interconnects.

13. The method of claim 1, wherein said release agent is temporarily adherent to said interconnects for protection.

14. The method of claim 1, wherein at least said release agent is permanently adherent to at least one of:
   said interconnects; and
   a component dielectric
for at least one of mechanical, thermal and reliability enhancement of an interconnection between at least a portion of said wafer and one of a corresponding substrate, a corresponding chip, a corresponding chip stack, a corresponding board, a corresponding package, a corresponding wafer, and a corresponding component.

15. The method of claim 1, wherein said interconnect material comprises one of solder, copper and a composite interconnect material.

16. The method of claim 1, further comprising the additional step of depositing an adhesive layer on said mold.

17. The method of claim 16, wherein said step of depositing said release agent and said step of depositing said adhesive layer are performed substantially simultaneously, and wherein said release agent and said adhesive are realized in a multilayer polymer system.

18. The method of claim 16, wherein said cavities are filled with said interconnect material through said adhesive layer.

19. The method of claim 16, wherein said adhesive layer is deposited subsequent to said step of filling said cavities with said interconnect material.

20. The method of claim 16, further comprising the additional step of securing said interconnects to a package for said wafer.

21. The method of claim 20, further comprising the additional step of activating said adhesive layer to bond said wafer to said package.

22. The method of claim 1, wherein said interconnects are generally column-shaped.

* * * * *